US006810276B1

United States Patent
Zeitlin

(10) Patent No.: US 6,810,276 B1
(45) Date of Patent: Oct. 26, 2004

(54) METHOD TO REDUCE MAGNETIZATION IN HIGH CURRENT DENSITY SUPERCONDUCTORS FORMED BY REACTION OF MULTI-COMPONENT ELEMENTS IN FILAMENTARY COMPOSITE SUPERCONDUCTORS

(75) Inventor: Bruce A. Zeitlin, Sarasota, FL (US)

(73) Assignee: Supergenics LLC, Sarasota, FL (US)

( * ) Notice: Subject to any disclaimer, the term of this patent is extended or adjusted under 35 U.S.C. 154(b) by 0 days.

(21) Appl. No.: 10/648,761

(22) Filed: Aug. 26, 2003

Related U.S. Application Data

(60) Provisional application No. 60/405,970, filed on Aug. 26, 2002.

(51) Int. Cl.$^7$ ............................ H01B 12/00; H01F 6/00; H01L 39/00
(52) U.S. Cl. ........................................ 505/231; 505/232

(58) Field of Search ................................. 505/231, 232, 505/234, 237; 174/125.1; 148/95, 96, 97, 98; 428/930

(56) References Cited

U.S. PATENT DOCUMENTS

| 3,848,075 A | * | 11/1974 | Yoo ........................... 174/15.5 |
| 4,454,380 A | * | 6/1984 | Turowski .................. 174/125.1 |
| 6,304,015 B1 | * | 10/2001 | Filatov et al. ............. 310/90.5 |
| 6,534,394 B1 | * | 3/2003 | Cooney et al. ............. 438/622 |

* cited by examiner

Primary Examiner—Colleen P. Cooke
(74) Attorney, Agent, or Firm—Katten Muchin Zavis Rosenman

(57) ABSTRACT

A method of producing multifilament superconducting Nb$_3$Sn wire with low bridging potential during reaction by introducing a diffusion/reaction barrier between the filaments as a radial sheet. The barrier is made of Ta, Va, a NbTa alloy or other ductile material.

11 Claims, 1 Drawing Sheet

METHOD TO REDUCE MAGNETIZATION IN HIGH CURRENT DENSITY SUPERCONDUCTORS FORMED BY REACTION OF MULTI-COMPONENT ELEMENTS IN FILAMENTARY COMPOSITE SUPERCONDUCTORS

CROSS-REFERENCE TO RELATED APPLICATION

The present application claims the benefit under 35 U.S.C. § 119(e) of U.S. Provisional Application No. 60/405,970, filed on Aug. 26, 2002.

This invention was developed under an SBIR grant from the DOE under grant #DEFG0299ER82899

BACKGROUND $Nb_3Sn$ is a brittle compound that must be formed in situ at its final size through a heat treatment during the course of which the tin reacts with the niobium. Two processes are currently used to manufacture $Nb_3Sn$, The most popular process to form the conductor is the bronze process in which filaments of Nb are drawn down in a matrix of CuSn, bronze. During the following heat treatment, the tin diffuses through the bronze to produce $Nb_3Sn$ while reacting with niobium. The second process is the Internal Tin process in which the tin is incorporated in elemental form, often with additives, and then heat-treated to diffuse the tin and react the Nb.

$Nb_3Sn$ superconductor wire is fabricated from a large number of metallic filaments. $Nb_3Sn$ is an intermetallic compound having a well-defined stoichiometry, typically obtained by treatment by high heat for an extended period of time. These compounds are important in industry because of their superior high field properties. The most important criterion in determining the usefulness and quality of the $Nb_3Sn$ superconductor is Jc, which depends on the conductor composition. The critical current densities in multifilament $Nb^3Sn$ superconductors are increased as the ratio of $Nb_3Sn$ to matrix increases in the superconductor. Filament uniformity and the amount of superconductor in the wire are the most important parameters. The inherent quality of the $Nb_3Sn$ which is effected by specific dopants to enhance the grain size of the material also has an effect on current density values.

The preferred technique used to fabricate high current density $Nb_3Sn$ wire is the Internal Tin process as the volume fractions of Sn and Nb can be much higher than in the bronze process. Bronze with Sn contents above 15 wt % is too brittle to draw, while in the Internal Tin process, the $Nb_3Sn$ volume fraction can be as great as 60% or so, excluding any copper stabilizer that may be added.

In superconducting wire manufactured by the internal diffusion method, the Sn base metal material is disposed at the center of the module and, hence, the space between adjacent $Nb_3Sn$ filaments is as narrow as about a half of the spacing between such filaments arranged in accordance with the bronze method. For this reason the Nb base metal filaments tend to come into contact with each other to combine with each other when the superconducting wire precursor is heat-treated, thus resulting in an increase in the effective filament diameter ($d_{eff}$), which greatly influences the electrical characteristics of the superconducting wire.

The effective filament diameter is a measure of the functionality of the conductor. It represents the width of magnetization of the superconducting wire, and Jc represents the critical current density in these conditions. As a result, a problem arises that although the resulting superconducting wire suffers no problem with respect to DC current, it suffers a large hysteresis loss when a pulse current flows therein. A large effective filament diameter, $d_{eff}$, caused by actual large filament diameters or by filament bridging, produces large AC losses and poor field quality. The effective filament diameter is preferably maintained in the range of from about 5 μmicrons to about 100 μmicrons; preferably in the range of from about 5 μmicrons to about 40 μmicrons.

It is desirable to maximize the current density in the multifilament conductor. One method being used to significantly increase the current density in multifilament $Nb_3Sn$ is to increase the volume fraction of both Nb and Sn in various internal tin process composites while minimizing factors that cause a high $d_{eff}$.

Upon reaction with Sn to form $Nb_3Sn$, the filaments in the $Nb_3Sn$ composites expand by about 39% in area. This expansion results in filament bridging such that the filaments act, when placed in swept magnet fields, as if they were essentially one. This can lead to instability of the conductor as a result of flux jumps and distorts the low field magnet field uniformity.

Target specifications set by the High Energy Physics community require the effective filament diameter in the $Nb_3Sn$ composites to be less than 40 microns, with current densities above 3000A/mm$^2$ at 12 Tesla (T). This combination is presently unachievable without a method to minimize the filament bridging.

Thus, it is an object to provide a process for fabricating $Nb_3Sn$ wire that controls the amount of filament bridging.

It is a further object of this invention to increase the ratio of $Nb_3Sn$ to matrix in the conductor.

SUMMARY

The invention provides a method of producing multifilament superconducting $Nb_3Sn$ wire with low bridging potential. To control the bridging of the filaments during reaction a ductile diffusion/reaction barrier is introduced between the filaments as a radial sheet. The barrier may be constructed of Ta, Va, a NbTa alloy or combinations of such. Other ductile materials such as a sandwich of Nb about the aforementioned elements are also useful.

These radial barriers may be allowed to react as the superconductor is formed if they possess low critical temperature and field characteristics. In one embodiment of the disclosure a circumferential barrier is also present. The preferred outer or circumferential barrier is Nb, which partially reacts and adds to the current density. Other suitable outer barriers are Ta, and Va. A pure Ta barrier will not react to form a superconductor while the others will form poor superconductors with low critical field characteristics.

The overlap of the barrier prevents the full circumference from reacting, which would defeat the radial barrier's purpose. Additional radial barriers, as many as twelve [12] but preferably no more than six [6] and most preferably no more than three [3] may be utilized to further segment the filaments depending on the $d_{eff}$ specification.

After reaction the filaments act with an effective diameter of not greater than the area represented by each pie segment. Hence the magnetization of the conductor can be controlled and designed to meet various specifications, such as that required for High Energy Physics accelerator magnets (40–60 microns).

As additional radial barriers are introduced the volume fractions of Nb and hence $Nb_3Sn$ are likely to be reduced such that a trade off in current density vs. magnetization has to be made. Optimally the volume fraction of $Nb_3Sn$ should be at least 50%; preferably at least 60%. The approximate loss that occurs per additional barrier is about 1.2% per barrier.

DETAILED DESCRIPTION OF THE INVENTION

Figure 1:
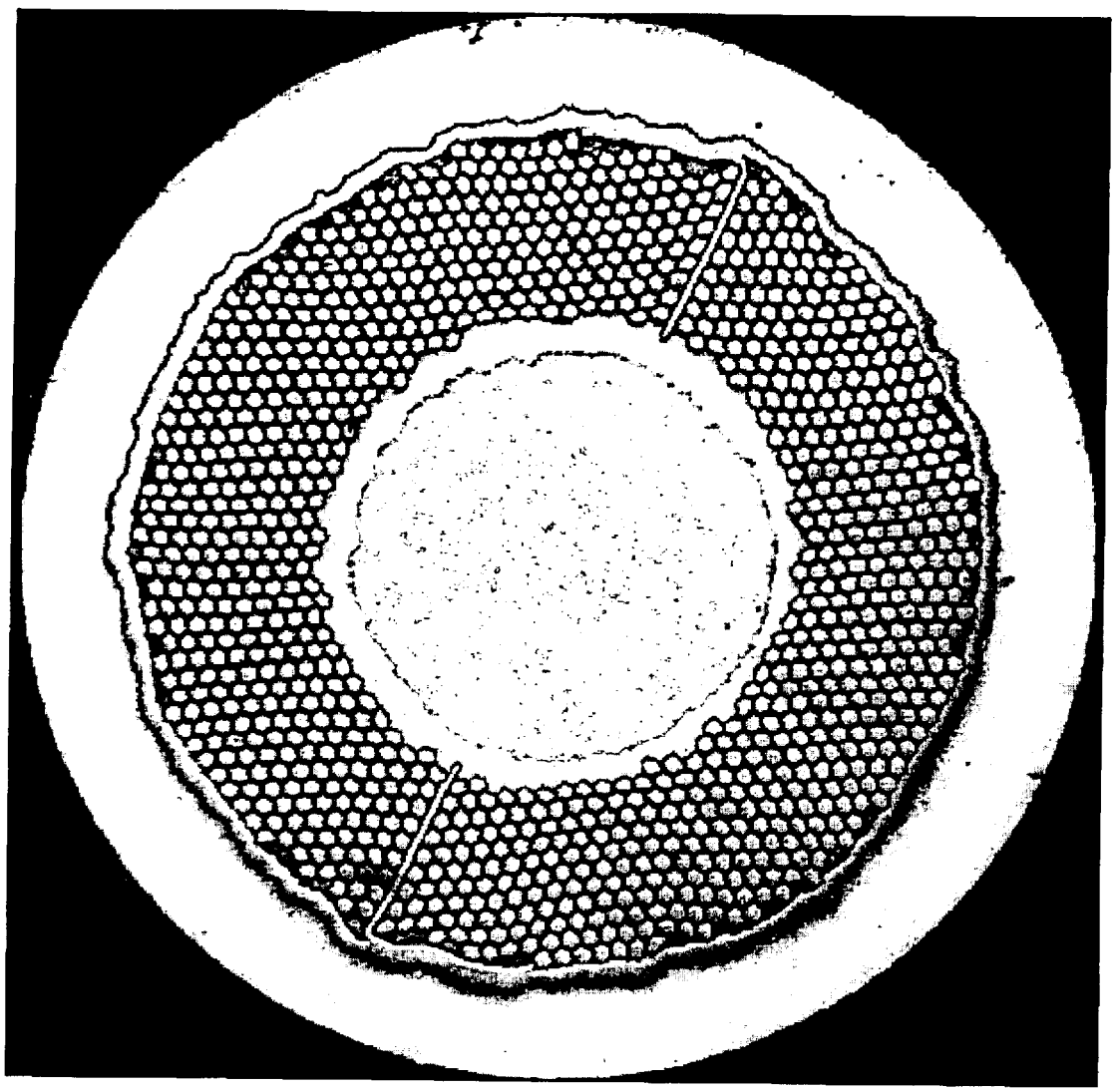
FIG. 1 is cross section of a $Nb_3Sn$ superconductor of the invention prior to reaction of the tin and niobium.

The barrier is introduced during the assembly of the composite billet, which is carried out in the usual manner of fabrication of superconducting billets described in the literature, such as, inter alia, "Continued Progress on a Low Cost High Current Density Mono Element Internal Tin Conductor (MEIT) with Integral Barriers", Proceedings of the Applied Superconductivity Conference—2002, to be published in the IEEE Trans. on Applied Superconductivity and incorporated herein and made a part hereof.

The barriers have to be of sufficient length both in their radial direction and circumference to prevent the $Nb_3Sn$ formed upon reaction from bridging between the segments of the pie. The circumference length of the radial barrier is preferably 10% of the total circumference of the Nb outer diffusion barrier. It can be shorter than this preferred length as, in principle, the length only has to be such that the normal reaction layer of the shell is broken by a length comparable to a filament width. A long length is desirable to assure that the tin does not react underneath the overlap. The hot extrusion followed by wire drawing essentially bonds all of the components together to form a metallurgical bond.

FIG. 1 shows a cross section of a niobium-tin composite superconductor precursor prior to reaction to form the $Nb_3Sn$ superconductor. The center is a core of copper that will be replaced with Sn, Nb filaments, an outer Nb diffusion barrier, a Nb60Ta radial reaction barrier, with an outer copper stabilizer. In FIG. 1 the Nb60Ta radial reaction barrier extends from the core to the outer Nb diffusion barrier.

Wire of various diameters was drawn from the $Nb_3Sn$ composites comprising as many as two barriers. Wire with a diameter as small as 0.254 mm was drawn from this material proving that the internal radial fins do not interfere with the practical processing of the wire of this invention.

Other configurations using multiples of these elements can also be made such as in the standard internal tin processes.

In the Mono Element Internal Tin process (MEIT) of which FIG. 1 gives an illustration, the use of an internal barrier can allow the use of this wire at larger diameters as flux jumping can be reduced. As the MEIT process appears to have significant cost advantage over conventional conductors this will expand the range of applications available to this concept. This also expands the use of Nb barriers that can contribute to the performance while being more ductile and less expensive than the conventional Ta and TaNb barriers used.

What is claimed is:

1. In a method of producing an multi-element superconducting wire, where the superconductor precursor consists of mono-element filaments which react with at least one other element during the production process to form multi-element filaments, which filaments expand during the production process and which filaments are prone to filament bridging during use, the improvement comprising incorporating in the superconducting wire least one bridging barrier extending radially from the center to the outer edge of the wire.

2. The method of claim 1 where the multi-element filament is $Nb_3Sn$.

3. The method of claim 1 where the radially extending barrier material is selected from the group consisting of Ta, Va, NbTa alloys, combinations thereof and sandwiches of Nb surrounding such other materials.

4. The method of claim 1 where the effective filament diameter is in the range of from about 5 to about 100 μmicrons.

5. The method of claim 1 where the effective filament diameter is in the range of from about 5 to about 40 μmicrons.

6. The method of claim 1 further comprising incorporating an Nb circumferential barrier.

7. The method of claim 1 comprising from 2 to about 12 barriers.

8. The method of claim 1 comprising from 2 to about 6 barriers.

9. A multifilament composite material comprising a copper core, a multitude of niobium-tin filaments, an outer diffusion barrier, at least one radial reaction barrier.

10. The composite material of claim 9 also comprising an outer copper stabilizer layer.

11. The product of the process of claim 1 where the volume fraction of the $Nb_3Sn$ is at least about 50 volume percent.

* * * * *